United States Patent
James

(10) Patent No.: US 7,054,161 B1
(45) Date of Patent: May 30, 2006

(54) SLOTTED ADHESIVE FOR DIE-ATTACH IN BOC AND LOC PACKAGES

(76) Inventor: Stephen L. James, 3873 E. Alta Ridge Dr., Boise, ID (US) 83716

( * ) Notice: Subject to any disclaimer, the term of this patent is extended or adjusted under 35 U.S.C. 154(b) by 0 days.

(21) Appl. No.: 09/551,906

(22) Filed: Apr. 19, 2000

(51) Int. Cl.
   *H05K 7/02* (2006.01)
   *H05K 7/06* (2006.01)
   *H05K 7/08* (2006.01)

(52) U.S. Cl. .................. 361/760; 361/720; 361/736; 174/259; 257/753; 257/774

(58) Field of Classification Search ............. 361/760, 361/764, 771, 684, 718, 807, 736, 720, 748, 361/677; 257/753, 774, 782, 700–104, 723–724, 257/777–778; 174/259–260, 102 SC, 106 SC, 174/117 A; 428/209–210
See application file for complete search history.

(56) References Cited

U.S. PATENT DOCUMENTS

| | | | |
|---|---|---|---|
| 5,343,363 A * | 8/1994 | Greeson et al. | 361/749 |
| 5,347,428 A * | 9/1994 | Carson et al. | 361/760 |
| 5,644,247 A * | 7/1997 | Hyun et al. | 324/755 |
| 5,721,450 A * | 2/1998 | Miles | 257/667 |
| 5,844,348 A * | 12/1998 | Gamo | 310/340 |
| 6,130,480 A * | 10/2000 | Ohuchi et al. | 257/738 |
| 6,260,264 B1 * | 7/2001 | Chen et al. | 29/832 |
| 6,452,790 B1 * | 9/2002 | Chu et al. | 361/683 |
| 6,743,658 B1 * | 6/2004 | Corisis | 438/106 |

FOREIGN PATENT DOCUMENTS

JP         361056434 A  *  3/1986

* cited by examiner

*Primary Examiner*—Kamand Cuneo
*Assistant Examiner*—Hung S. Bui

(57) ABSTRACT

A method and apparatus for attaching an integrated circuit die to a leadframe or substrate. More specifically, a patterned adhesive material is used to attach an integrated circuit die to a leadframe in an LOC package, or a substrate in a BOC package. The patterned adhesive may be a tape or any other suitable material for attaching an I/C to a substrate or leadframe. The adhesive patterns may be configured to form strips of adhesive material or may be a solid piece of material with apertures cut therethrough.

66 Claims, 6 Drawing Sheets

SLOTTED ADHESIVE FOR DIE-ATTACH IN BOC AND LOC PACKAGES

BACKGROUND OF THE INVENTION

1. Field of the Invention

The present invention relates generally to integrated circuit packaging and, more particularly, to a method for attaching an integrated circuit die to a leadframe or substrate.

2. Background of the Related Art

This section is intended to introduce the reader to various aspects of art which may be related to various aspects of the present invention which are described and/or claimed below. This discussion is believed to be helpful in providing the reader with background information to facilitate a better understanding of the various aspects of the present invention. Accordingly, it should be understood that these statements are to be read in this light, and not as admissions of prior art.

The packaging of electrical circuits is a key element in the technological development of any device containing electrical components. A single integrated circuit die is typically encapsulated within a sealed package to be mounted on a printed circuit board (PCB) or a similar apparatus for incorporation into a system. The integrated circuit die is generally encapsulated within a molding compound to protect the die from external contamination or physical damage. Because the integrated circuit die is generally encapsulated, the encapsulated integrated circuit package must typically also provide a system of interconnects for electrically coupling the integrated circuit die to a PCB or other external circuitry.

Two common surface mount techniques are using lead-on-chip (LOC) and board-on-chip (BOC) packaging. For LOC packages, an integrated circuit die is typically attached to a leadframe. A leadframe is a metal frame comprised of a plurality of lead fingers. The integrated circuit die is physically attached to the lead fingers by an adhesive, such as tape or epoxy. Prior to the encapsulation process, the adhesive material is disposed onto the die, and the die is mounted to the lower surfaces of the lead fingers. The lead fingers are electrically coupled to the integrated circuit die by bond wires which extend from the lead fingers to pads along the center of the integrated circuit die. The leadframe package is then encapsulated such that the lead fingers extending from the integrated circuit die protrude from the edges of the molding compound used to encapsulate the module. A molded package is then excised from the leadframe resulting in an encapsulated integrated circuit die with lead fingers extending outside of the molding compound to electrically couple the integrated circuit die to a PCB or other electrical device.

For BOC packages, the integrated circuit die is attached to a substrate. The integrated circuit die is mounted on the substrate "face-down." In this instance, the substrate contains a slot. Since the integrated circuit die is mounted face-down, the bond pads on the surface of the integrated circuit die are arranged to correlate with the slot opening in the substrate. Bond wires are attached from the bond pads on the integrated circuit die to the backside of the substrate. The substrate contains conductive traces to distribute electrical signals to pads along the backside of the substrate which will eventually be attached to a PCB or other external device.

Alternately, the integrated circuit die may be attached to the substrate "face-up". That is to say that the side of the integrated circuit die containing the bond pads for wire bonding the integrated circuit die to the substrate are left exposed on the top surface. This is known as chip-on-board or COB packaging. The backside of the integrated circuit die, i.e., the side not containing the bond pads, is adhered to the substrate. In a COB package, bond wires are attached from the surface of the integrated circuit die down to pads on the surface of the substrate. The substrate contains conductive traces which route signals from the top side of the substrate to the backside of the substrate.

Regardless of whether the integrated circuit die is mounted to the substrate face-up (COB) or face-down (BOC), either the die or the substrate is generally disposed with an adhesive, such as tape or epoxy, to attach the die to the substrate. Finally, the entire package is generally encapsulated in a molding compound. Various techniques, such as a pin grid array (PGA) or a ball grid array (BGA), may be incorporated to provide a means of connecting the integrated circuit package to the PCB or other external device.

Regardless of whether LOC or BOC/COB packaging technology is incorporated, a key component in the packaging process is the attachment of the integrated circuit die to the leadframe (LOC) or substrate (BOC/COB). One means of attaching the integrated circuit die to the leadframe or the substrate is to cover the die or substrate (BOC/COB) with an adhesive tape. For LOC packages, one or two solid strips of tape are disposed on the topside of the die to facilitate attachment to the leadframe. For BOC/COB packages, one or two solid strips of adhesive tape may be disposed on the die or the substrate in order to facilitate the attachment of the die to the substrate. Typically, the attachment of the die to the leadframe or substrate creates the biggest reliability issues in package yield. Pressure created by temperature variation, moisture sensitivity and thermal exposure often causes die attach failures. Thus, a method and apparatus for attaching the integrated circuit die to a leadframe or substrate which reduces the likelihood of package failure due to die attach failure would be desirable.

The present invention may address one or more of the problems set forth above.

SUMMARY OF THE INVENTION

Certain aspects commensurate in scope with the disclosed embodiments are set forth below. It should be understood that these aspects are presented merely to provide the reader with a brief summary of certain forms the invention might take and that these aspects are not intended to limit the scope of the invention. Indeed, the invention may encompass a variety of aspects that may not be set forth below.

In one embodiment of the present invention, there is provided a system having a processor and an integrated circuit package. The integrated circuit package has an integrated circuit die, and a substrate attached to the integrated circuit die by an adhesive material. The adhesive material is disposed in at least one area bounded by an at least partially adhesive periphery. Less than 100% of the area bounded by the periphery is covered by the adhesive material.

In another embodiment of the present invention, there is provided a system board having a processor and an integrated circuit device. The integrated circuit device is made up of a memory device and a substrate attached to the memory device by an adhesive material. The adhesive material is disposed in at least one bonded area by an at least partially adhesive periphery. Less than 100% of the area bonded by the periphery is covered by the adhesive material.

In yet another embodiment of the present invention, there is provided an integrated circuit package. The integrated circuit package has an integrated circuit die, and a substrate attached to the integrated circuit die by an adhesive material. The adhesive material is disposed in at least one area bounded by an at least partially adhesive periphery. Less than 100% of the area bounded by the periphery is covered by the adhesive material.

In still another embodiment of the present invention, there is provided a method of manufacturing an integrated circuit package, comprising the acts of: providing a substrate; disposing an adhesive material onto the substrate within at least one area bounded by at least a partially adhesive periphery and covering less than 100% of the area bounded by the adhesive periphery; and disposing an integrated circuit die onto the adhesive material.

In a further embodiment of the present invention, there is provided a method of manufacturing an integrated circuit package, comprising the acts of: providing a substrate having an adhesive material thereon, the adhesive material being disposed in at least one area bounded by an at least partially adhesive periphery and covering less than 100% of the area bounded by the adhesive periphery disposing an integrated circuit die onto the adhesive material.

DESCRIPTION OF THE DRAWINGS

The foregoing and other advantages of the invention will become apparent upon reading the following detailed description and upon reference to the drawings in which.

DETAILED DESCRIPTION OF SPECIFIC EMBODIMENTS

One or more specific embodiments of the present invention will be described below. In an effort to provide a concise description of these embodiments, not all features of an actual implementation are described in the specification. It should be appreciated that in the development of any such actual implementation, as in any engineering or design project, numerous implementation-specific decisions must be made to achieve the developers' specific goals, such as compliance with system-related and business-related constraints, which may vary from one implementation to another. Moreover, it should be appreciated that such a development effort might be complex and time consuming, but would nevertheless be a routine undertaking of design, fabrication, and manufacture for those of ordinary skill having the benefit of this disclosure.

Figure 1:
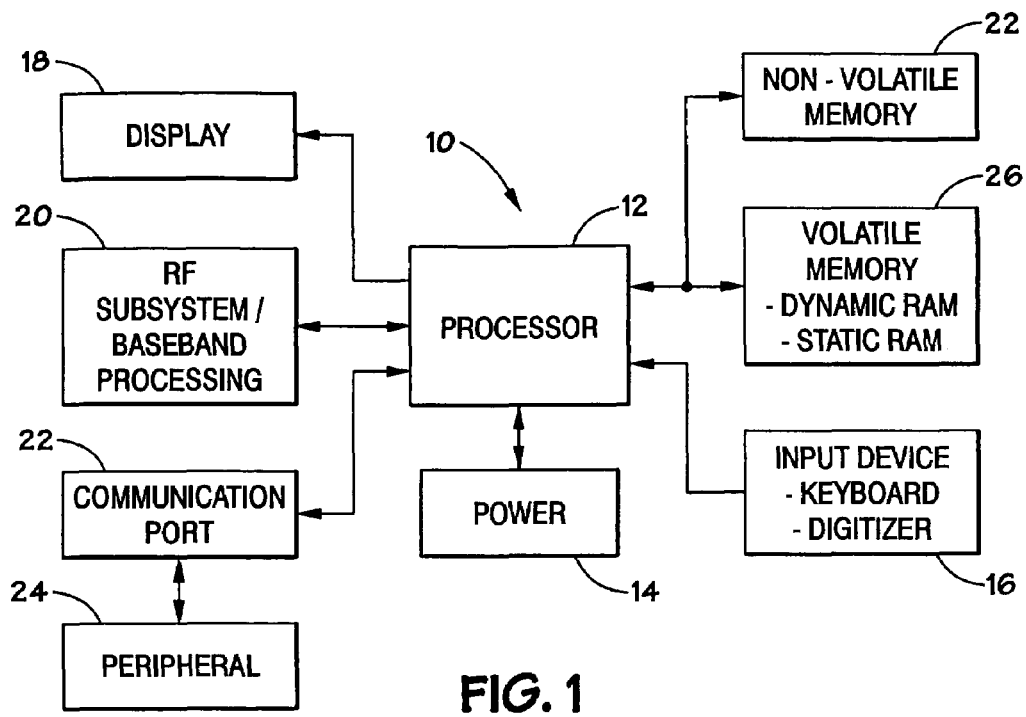
FIG. 1 illustrates a block diagram of an exemplary processor-based device in accordance with the present invention.

Turning now to the drawings, and referring initially to FIG. 1, a block diagram depicting an exemplary processor-based device generally designated by the reference numeral 10 is illustrated. The device 10 may be any of a variety of different types, such as a computer, pager, cellular telephone, personal organizer, control circuit, etc. In a typical processor-based device, a processor 12, such as a microprocessor, controls many of the functions of the device 10.

The device 10 typically includes a power supply 14. For instance, if the device 10 is portable, the power supply 14 would advantageously include permanent batteries, replaceable batteries, and/or rechargeable batteries. The power supply 14 may also include an AC adapter, so the device may be plugged into a wall outlet, for instance. In fact, the power supply 14 may also include a DC adapter, so that the device can be plugged into a vehicle cigarette lighter, for instance.

Various other devices may be coupled to the processor 12 depending upon the functions that the device 10 performs. For instance, a user interface 16 may be coupled to the processor 12. The user interface 16 may include buttons, switches, a keyboard, a light pen, a mouse, and/or a voice recognition system, for instance. A display 18 may also be coupled to the processor 12. The display 18 may include an LCD display, a CRT, LEDs, and/or an audio display, for example. Furthermore, an RF subsystem/baseband processor 20 may also be coupled to the processor 12. The RF subsystem/baseband processor 20 may include an antenna that is coupled to an RF receiver and to an RF transmitter (not shown). A communications port 22 may also be coupled to the processor 12. The communications port may be adapted to be coupled to a peripheral device 24, such as a modem, a printer, or a computer, for instance, or to a network, such as a local area network or the Internet, for instance. Volatile memory 26 and non-volatile memory 28 may also be coupled to the processor 12.

Figure 2:
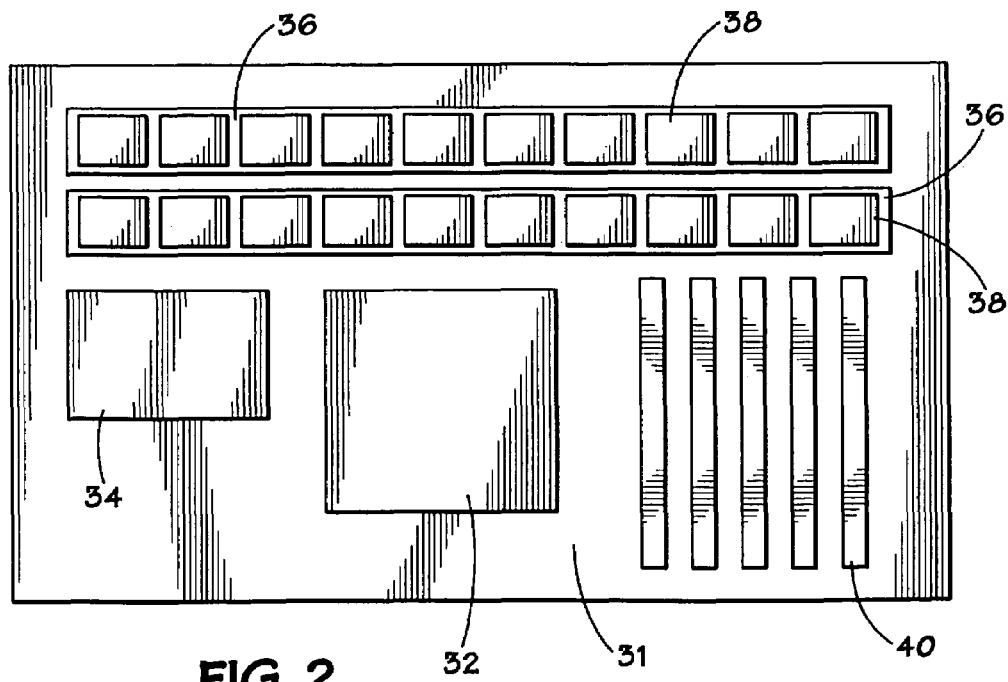
FIG. 2 illustrates a plan view of a circuit board having various devices employed thereon.

Referring to FIG. 2, a circuit board 31 is shown having various devices and connections coupled to its surface. A microprocessor 32 is shown along with a ROM device 34 and a set of memory modules 36, each containing a plurality of RAM chips 38. A plurality of connections or ports 40 are also located on the circuit board 31 allowing for connection to various peripheral devices and expansion modules. In a computer application, for example, such devices and expansion modules might include sound cards, video cards, additional memory modules or connections for input and output peripherals. While the present embodiment has a direct relation to memory chips such as the ROM device 34 and RAM chip 38, the techniques as described below, may be applied to any device package having similar mounting characteristics including, if desired, the microprocessor 32.

Figure 3:
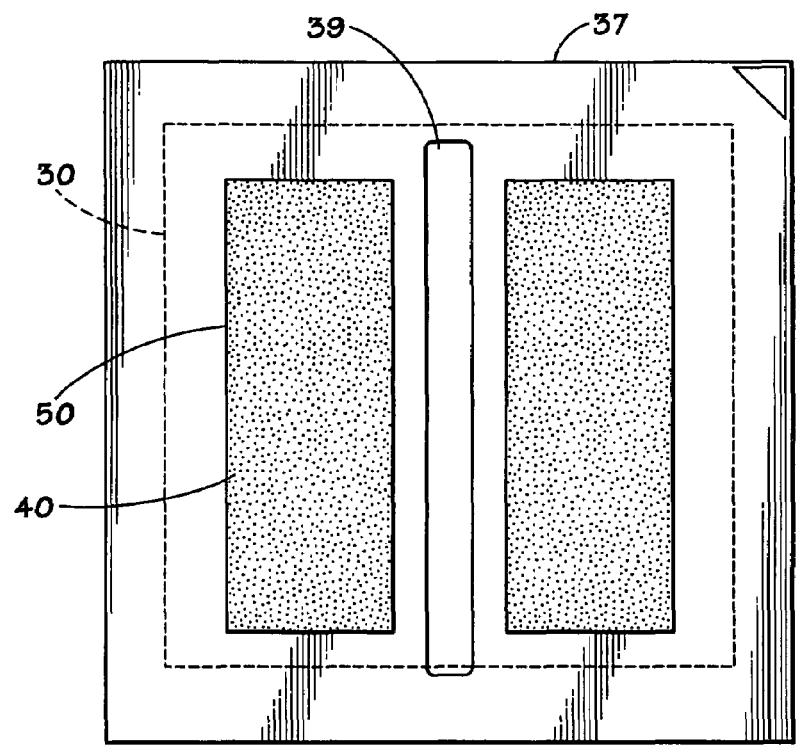
FIG. 3 illustrates a board on chip substrate with an exemplary tape decal for attaching an integrated circuit die.

FIG. 3 illustrates a top view of an exemplary BOC substrate 37. The substrate 37 comprises a slot 39 through which bond wires may pass to electrically couple an integrated circuit die 30 (shown by phantom lines) to the substrate 37. The face of the integrated circuit die 30 comprises bond pads (not shown) which correlate with the slot 39. Once the integrated circuit die 30 is mounted face down on the substrate 37, the substrate 37 may be flipped. The bond pads on the integrated circuit die 30 will be visible from the backside of the substrate 37 through the slot 39. The bond pads on the integrated circuit die 30 may then be electrically coupled to bond pads on the backside of the substrate 37 by bond wires.

The integrated circuit die 30 is attached to the substrate 37 by an adhesive material, such as an adhesive tape 40. A single strip of adhesive tape 40 is generally disposed on either side of the slot 39 in the substrate 37. The integrated circuit die 30 can then be placed on top of the adhesive tape 40 to secure the integrated circuit die 30 to the substrate 37. Each large strip of adhesive tape 40 occupies a bounded area with an adhesive periphery 50, where the area is completely covered by the adhesive tape 40. Disadvantageously, the limiting reliability factor in most BOC packages is the tape interface between the integrated circuit die and the substrate 37. During temperature and thermal testing, moisture and air may expand and cause separation of the integrated circuit die 30 and the substrate 37, due to the pressure within the package.

Figure 4:
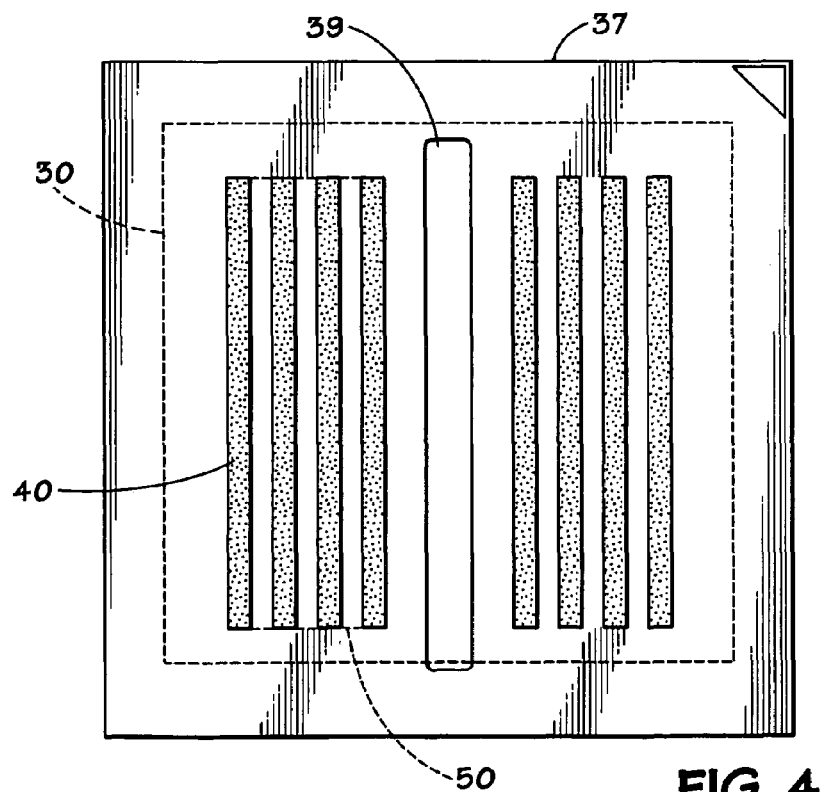
FIG. 4 illustrates a board-on-chip substrate with an adhesive pattern for attaching an integrated circuit die in accordance with the present invention.

FIG. 4 illustrates a top view of one embodiment of an integrated circuit package. The integrated circuit die 30 is attached to the substrate 37 by adhesive 60 which is arranged in strips on the surface of the substrate 37. The strips of adhesive 60 may be formed in any suitable manner, such as from tape strips, screen printed adhesive, etc. The strips of adhesive 60 are disposed parallel to the slot 39. In this embodiment, the adhesive 60 occupies in the range of 30% to 90% and, here, about slightly more than 50% of the area bounded by the adhesive periphery 50. This partial coverage of the area within the bounded adhesive periphery 50 helps dissipate potential pressures within the package due to moisture and temperature variations. Advantageously, the dissipation of pressure resulting from the configuration of the adhesive 60 reduces the number of package failures due to separation of the integrated circuit die 30 and the substrate 37.

Figure 5:
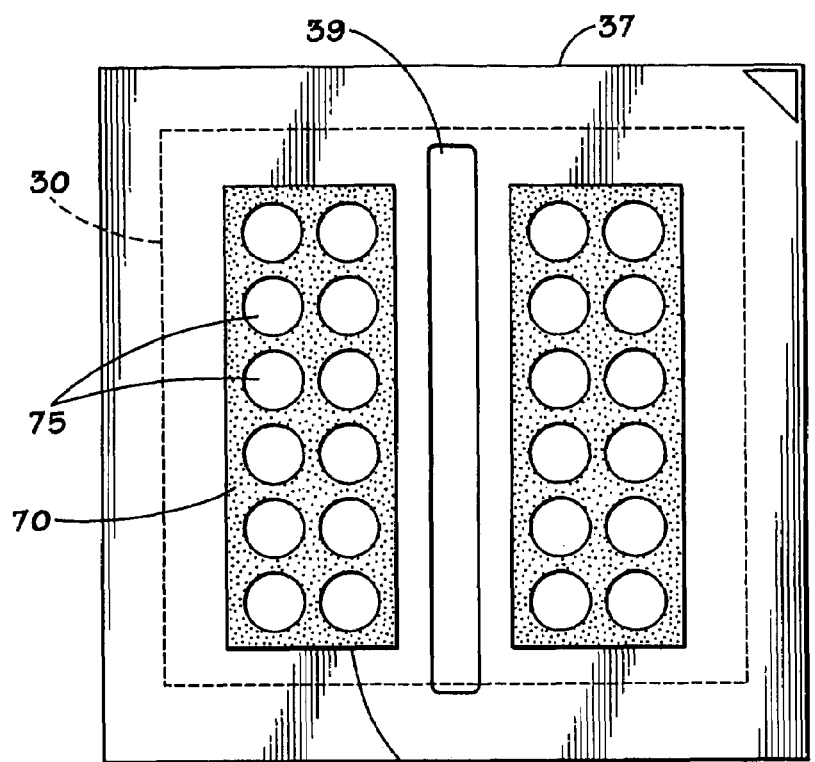
FIG. 5 illustrates a first alternate embodiment of a board-on-chip substrate with an adhesive pattern for attaching an integrated circuit die in accordance with the present invention.

FIG. 5 illustrates a top view of a first alternate embodiment of an integrated circuit package. The integrated circuit die 30 is attached to the substrate 37 by adhesive 70. The strips of adhesive 70 may be formed in any suitable manner, such as from tape strips, screen printed adhesives, etc. The adhesive 70 includes of a plurality of apertures 75. The apertures 75 are circular "cut-outs" in the adhesive 70 which are arranged in two rows running parallel to the slot 39. Thus, the apertures 75 are openings in the adhesive 70, which provide exposed substrate areas within the bounded adhesive periphery 50. The adhesive 70 occupies less than 100% of the area bounded by the adhesive periphery 50, and in this embodiment about 50%. This partial coverage of the area within the bounded adhesive periphery 50 helps dissipate potential pressures within the package due to moisture and temperature variations. Advantageously, the dissipation of pressure resulting from the configuration of the adhesive 70 reduces the number of package failures due to separation of the integrated circuit die 30 and the substrate 37.

Figure 6:
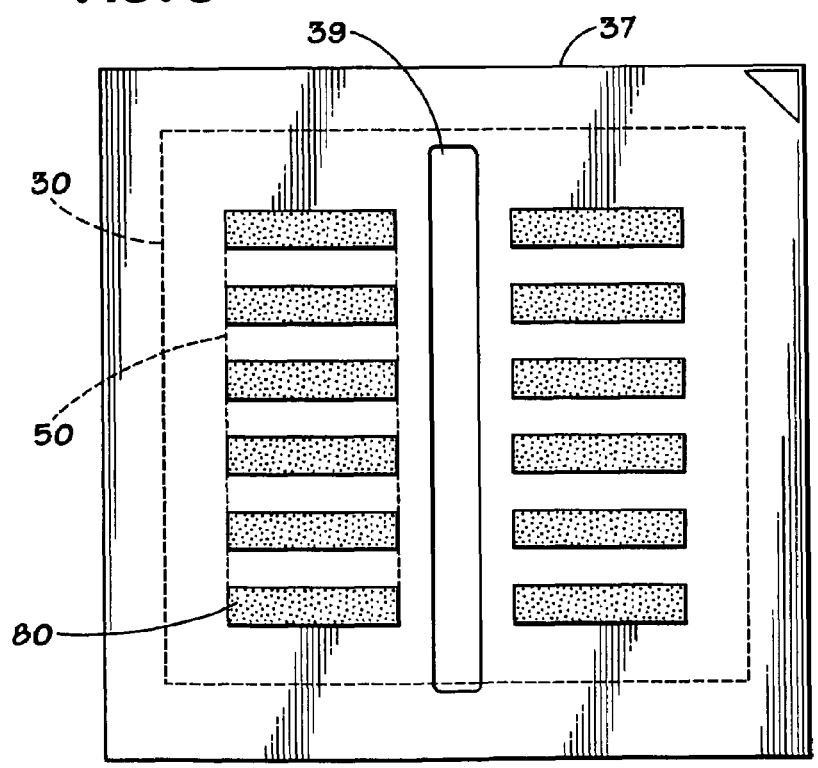
FIG. 6 illustrates a second alternate embodiment of a board-on-chip substrate with an adhesive pattern for attaching an integrated circuit die in accordance with the present invention.

FIG. 6 illustrates a top view of a second alternate embodiment of an integrated circuit package. The integrated circuit die 30 is attached to the substrate 37 by adhesive 80 which is arranged in strips on the surface of the substrate 37. The strips of adhesive 80 may be formed in any suitable manner, such as from tape strips, screen printed adhesives, etc. The strips of adhesive 80 are disposed perpendicular to the slot 39. In this embodiment, the adhesive 80 occupies slightly more than 50% of the area bounded by the adhesive periphery 50. This partial coverage of the area within the bounded adhesive periphery 50 helps dissipate potential pressures within the package due to moisture and temperature variations. Advantageously, the dissipation of pressure resulting from the configuration of the adhesive 80 reduces the number of package failures due to separation of the integrated circuit die 30 and the substrate 37.

Figure 7:
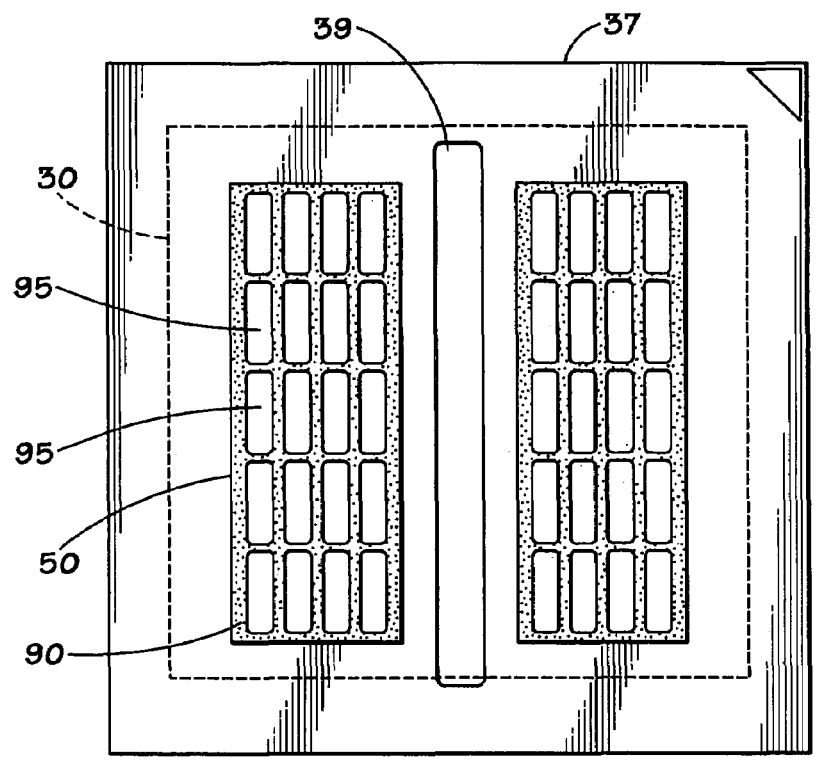
FIG. 7 illustrates a third alternate embodiment of a board-on-chip substrate with an adhesive pattern for attaching an integrated circuit die in accordance with the present invention.

FIG. 7 illustrates a top view a third alternate embodiment of an integrated circuit package. The integrated circuit die 30 is attached to the substrate 37 by adhesive 90. The strips of adhesive 90 may be formed in any suitable manner, such as from tape strips, screen printed adhesive, etc. The adhesive 90 includes a plurality of apertures 95. The apertures 95 are rectangular cut-outs in the adhesive 90 which are arranged in four rows running parallel to the slot 39. While the apertures 95 are illustrated as rectangles with curved corners, it should be evident that true rectangular cut-outs with 90 degree corners may also be used. Thus, the apertures 95 are openings in the adhesive 90, which provide exposed substrate areas within the bounded adhesive periphery 50 and in this embodiment about 30%. The adhesive 90 occupies less than 100% of the area bounded by the adhesive periphery 50. This partial coverage of the area within the bounded adhesive periphery 50 helps dissipate potential pressures within the package due to moisture and temperature variations. Advantageously, the dissipation of pressure resulting from the configuration of the adhesive 90 reduces the number of package failures due to separation of the integrated circuit die 30 and the substrate 37.

Figure 8:
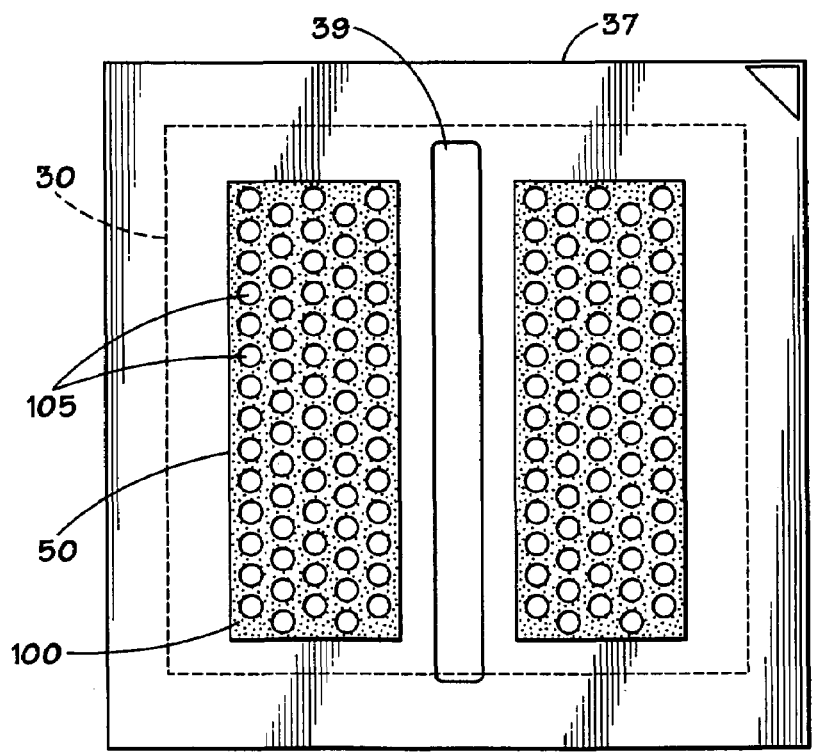
FIG. 8 illustrates a fourth alternate embodiment of a board-on-chip substrate with an alternate pattern for attaching an integrated circuit die in accordance with the present invention.

FIG. 8 illustrates a top view of a fourth alternate embodiment of an integrated circuit package. The integrated circuit die 30 is attached to the substrate 37 by adhesive 100. The strips of adhesive 100 may be formed in any suitable manner, such as from tape strips, screen printed adhesive, etc. The adhesive 100 includes a plurality of apertures 105. The apertures 105 are circular cut-outs in the adhesive 100 which are arranged in five staggered rows running parallel to the slot 39. Thus, the apertures 105 are openings in the adhesive 100, which provide exposed substrate areas within the bounded adhesive periphery 50. The adhesive tape 100 occupies less than 100% of the area bounded by the adhesive periphery 50, and about 50% in this embodiment. This partial coverage of the area within the bounded adhesive periphery 50 helps dissipate potential pressures within the package due to moisture and temperature variations. Advantageously, the dissipation of pressure resulting from the configuration of the adhesive 100 reduces the number of package failures due to separation of the integrated circuit die 30 and the substrate 37.

Figure 9:
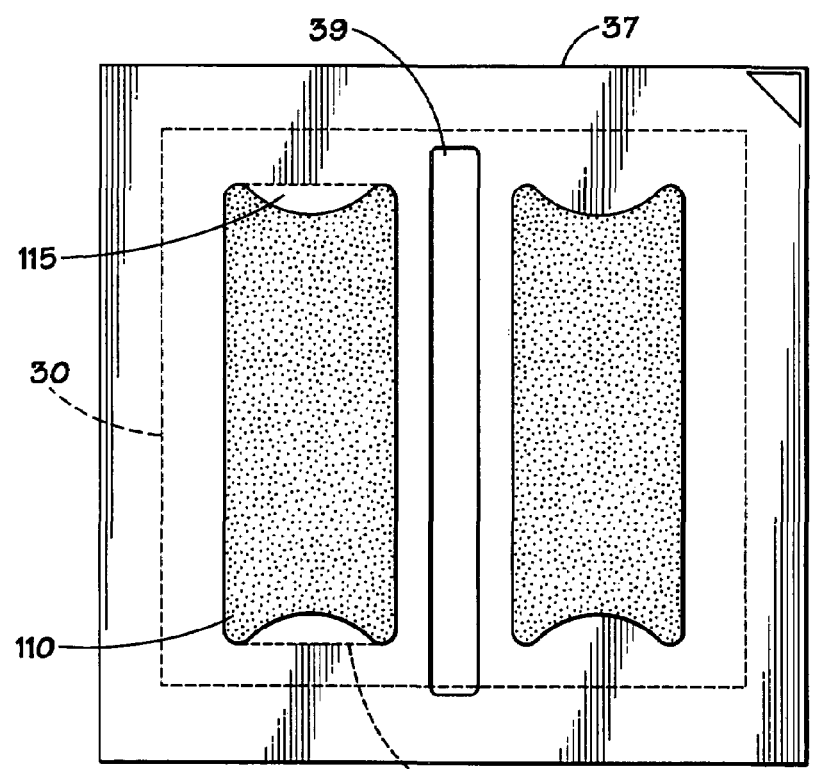
FIG. 9 illustrates a fifth alternate embodiment of a board-on-chip substrate with an adhesive pattern for attaching an integrated circuit die in accordance with the present invention.

FIG. 9 illustrates a top view of a fifth alternate embodiment of an integrated circuit package. The integrated circuit die 30 is attached to the substrate 37 by adhesive 110. The strips of adhesive 110 may be formed in any suitable manner, such as from tape strips, screen printed adhesive, etc. The adhesive 110 includes a plurality of apertures 115. The apertures 115 are curved cut-outs in the adhesive 110. The curved cut-outs may be arranged perpendicular to the slot 39, as shown, or the curved "cut-outs" may be arranged parallel to the slot 39. Thus, the apertures 115 are openings in the adhesive 110 which provide exposed substrate areas within the bounded adhesive periphery 50. The adhesive 110 occupies less than 100% of the area bounded by the adhesive periphery 50, and about 50% in this embodiment. This partial coverage of the area within the bounded adhesive periphery 50 helps dissipate potential pressures within the package due to moisture and temperature variations. Advantageously, the dissipation of pressure resulting from the configuration of the adhesive 110 reduces the number of package failures due to separation of the integrated circuit die 30 and the substrate 37.

Figure 10:
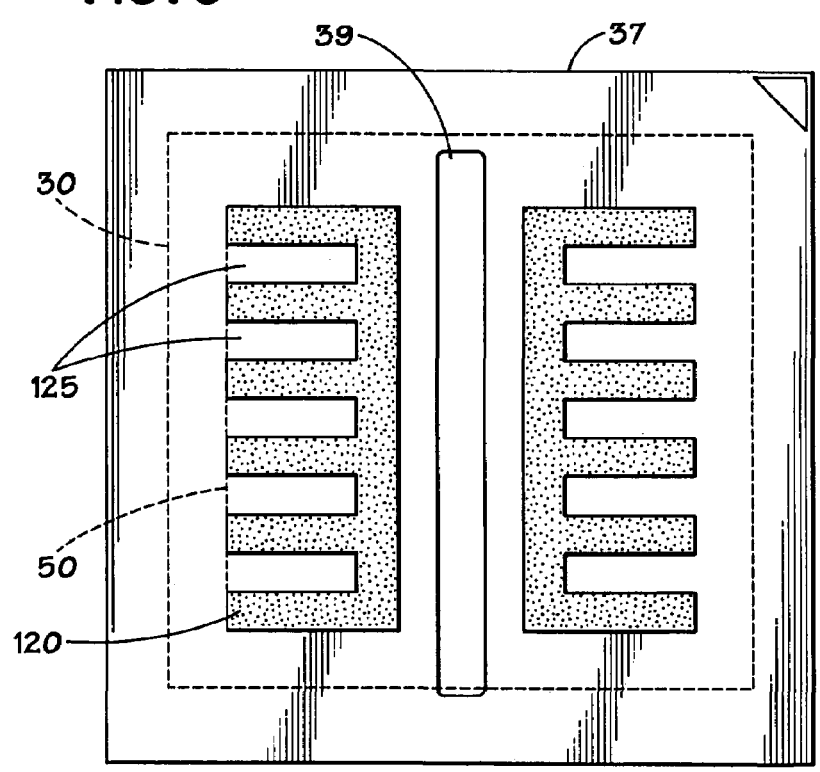
FIG. 10 illustrates a sixth alternate embodiment of a board-on-chip substrate with an adhesive pattern for attaching an integrated circuit die in accordance with the present invention.

FIG. 10 illustrates a top view of a sixth alternate embodiment of an integrated circuit package. The integrated circuit die 30 is attached to the substrate 37 by adhesive 120. The strips of adhesive 120 may be formed in any suitable manner, such as from tape strips, screen printed adhesive, etc. The adhesive 120 includes a plurality of apertures 125. The apertures 125 are rectangular cut-outs in the adhesive 120. The apertures 125 are configured to provide a comb pattern with a solid piece portion of the adhesive 120 extending parallel to the slot 39. The apertures 125 are openings in the adhesive 120 which provide exposed substrate areas within the bounded adhesive periphery 50. The adhesive 120 occupies less than 100% of the area bounded by the adhesive periphery 50, and about 60% in this embodiment. This partial coverage of the area within the bounded adhesive periphery 50 helps dissipate potential pressures within the package due to moisture and temperature variations. Advantageously, the dissipation of pressure resulting from the configuration of the adhesive 120 reduces the number of package failures due to separation of the integrated circuit die 30 and the substrate 37.

Figure 11:
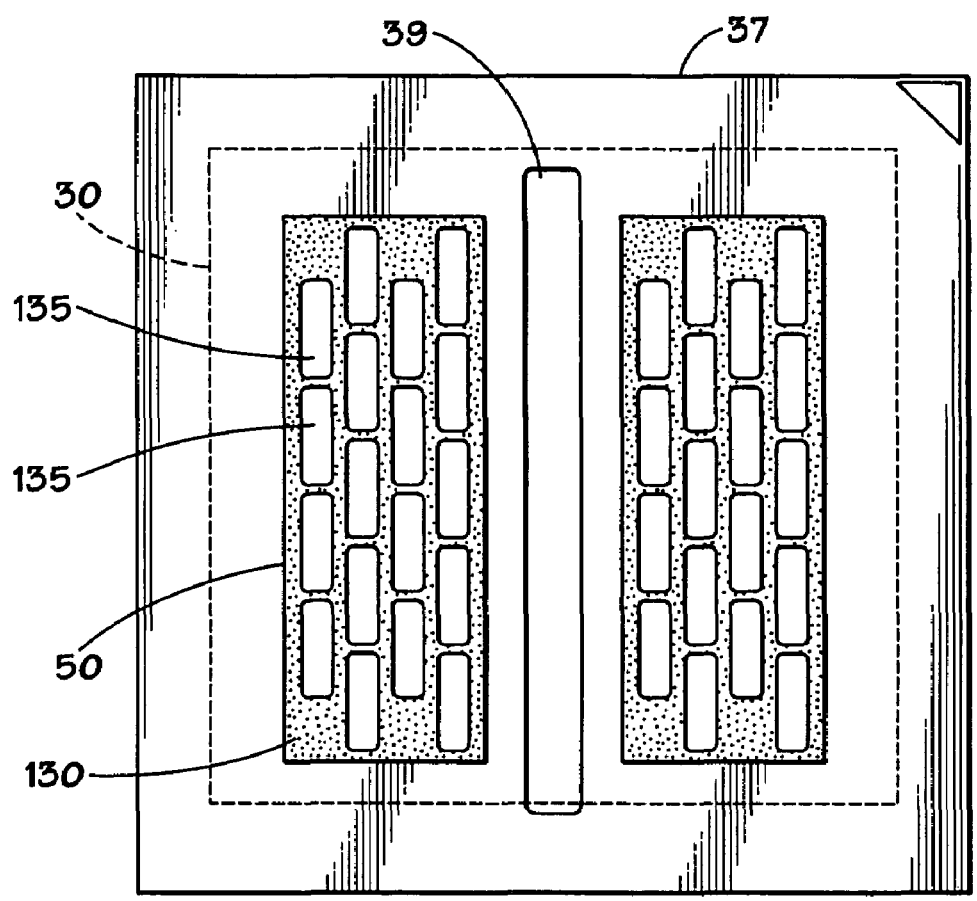
FIG. 11 illustrates a seventh alternate embodiment of a board-on-chip substrate with an adhesive pattern for attaching an integrated circuit die in accordance with the present invention.

FIG. 11 illustrates a top view a seventh alternate embodiment of an integrated circuit package. The integrated circuit die 30 is attached to the substrate 37 by adhesive 130. The strips of adhesive 130 may be formed in any suitable manner, such as from tape strips, screen printed adhesive, etc. The adhesive 130 includes a plurality of apertures 135. The apertures 135 are rectangular cut-outs in the adhesive 130 which are arranged in four staggered rows running parallel to the slot 39. While the apertures 135 are illustrated as rectangles with curved corners, it should be evident that true rectangular "cut-outs" with 90-degree corners may also be used. Thus, the apertures 135 are openings in the adhesive 130 which provide exposed substrate areas within the bounded adhesive periphery 50. The adhesive 130 occupies less than 100% of the area bounded by the adhesive periphery 50, and about 50% in this embodiment. This partial coverage of the area within the bounded adhesive periphery 50 helps dissipate potential pressures within the package due to moisture and temperature variations. Advantageously, the dissipation of pressure resulting from the configuration of the adhesive 130 reduces the number of package failures due to separation of the integrated circuit die 30 and the substrate 37.

While the exemplary embodiments described above illustrate the adhesive patterns using a BOC substrate, it should be evident that the invention could be practiced using a COB substrate or an LOC leadframe. Indeed, while the invention may be susceptible to various modifications and alternative forms, specific embodiments have been shown by way of example in the drawings and have been described in detail herein. However, it should be understood that the invention is not intended to be limited to the particular forms disclosed. Rather, the invention is to cover all modifications, equivalents, and alternatives falling within the spirit and scope of the invention as defined by the following appended claims.

What is claimed is:

1. A system comprising:
a processor; and
an integrated circuit package comprising an integrated circuit die and a substrate permanently coupled to the integrated circuit die by an adhesive material, the adhesive material being disposed in at least one area having a bounded adhesive periphery, wherein less than 100% of the area having the bounded adhesive periphery is covered by the adhesive material and wherein the area having the bounded adhesive periphery comprises a plurality of non-contiguous adhesiveless regions, wherein each of the plurality of adhesiveless regions is defined by a perimeter formed by the adhesive material or by the bounded adhesive periphery.

2. The system, as set forth in claim 1, wherein the integrated circuit die comprises a memory die.

3. The system, as set forth in claim 1, wherein the adhesive material comprises an adhesive tape.

4. The system, as set forth in claim 1, wherein the substrate comprises a slot.

5. The system, as set forth in claim 4, wherein the substrate comprises two areas bounded by an at least partially adhesive periphery, each area being disposed adjacent to the slot.

6. The system, as set forth in claim 5, wherein each of the two areas are rectangular.

7. The system, as set forth in claim 1, wherein the at least one area bounded by the at least partially adhesive periphery is 30%–90% covered by the adhesive material.

8. The system, as set forth in claim 1, wherein the adhesive material comprises a plurality of apertures.

9. The system, as set forth in claim 3, comprising circular cut-outs in the adhesive tape.

10. The system, as set forth in claim 3, comprising curved cut-outs in the adhesive tape.

11. The system, as set forth in claim 3, comprising substantially rectangular cut-outs in the adhesive tape.

12. The system, as set forth in claim 4, wherein the adhesive material comprises an adhesive tape, and wherein the adhesive tape comprises a plurality of adhesive strips disposed in the at least one area.

13. The system, as set forth in claim 12, wherein the adhesive strips comprise substantially rectangular strips extending generally parallel to the slot.

14. The system, as set forth in claim 12, wherein the adhesive strips comprise substantially rectangular strips extending generally perpendicular to the slot.

15. A system board comprising:
a processor; and
an integrated circuit device comprising:
a memory device; and
a substrate permanently coupled to the memory device by an adhesive material, the adhesive material being disposed in at least one area having a bounded adhesive periphery, wherein less than 100% of the area having the bounded adhesive periphery is covered by the adhesive material and wherein the area having the bounded adhesive periphery comprises a plurality of non-contiguous adhesiveless regions, wherein each of the plurality of adhesiveless regions is defined by a perimeter formed by the adhesive material or by the bounded adhesive periphery.

16. The system board, as set forth in claim 15, wherein the adhesive material comprises an adhesive tape.

17. The system board, as set forth in claim 15, wherein the substrate comprises a slot.

18. The system board, as set forth in claim 17, wherein the substrate comprises two areas bounded by an at least partially adhesive periphery, each area being disposed adjacent to the slot.

19. The system board, as set forth in claim 18, wherein each of the two areas are rectangular.

20. The system board, as set forth in claim 15, wherein the at least one area bounded by the at least partially adhesive periphery is 30%–90% covered by the adhesive material.

21. The system board, as set forth in claim 15, wherein the adhesive material comprises a plurality of apertures.

22. The system board, as set forth in claim 16, comprising circular cut-outs in the adhesive tape.

23. The system board, as set forth in claim 16, comprising curved cut-outs in the adhesive tape.

24. The system board, as set forth in claim 16, comprising substantially rectangular cut-outs in the adhesive tape.

25. The system board, as set forth in claim 17, wherein the adhesive material comprises an adhesive tape, and wherein the adhesive tape comprises a plurality of adhesive strips disposed in the at least one area.

26. The system board, as set forth in claim 25, wherein the adhesive strips comprise substantially rectangular strips extending generally parallel to the slot.

27. The system board, as set forth in claim 25, wherein the adhesive strips comprise substantially rectangular strips extending generally perpendicular to the slot.

28. An integrated circuit package comprising:
an integrated circuit die; and
a substrate permanently coupled to the integrated circuit die by an adhesive material, the adhesive material being disposed in at least one area having a bounded adhesive periphery, wherein less than 100% of the area having the bounded adhesive periphery is covered by the adhesive material and wherein the area having the bounded adhesive periphery comprises a plurality of non-contiguous adhesiveless regions, wherein each of the plurality of adhesiveless regions is defined by a perimeter formed by the adhesive material or by the bounded adhesive periphery.

29. The package, as set forth in claim 28, wherein the integrated circuit die comprises a memory die.

30. The package, as set forth in claim 28, wherein the adhesive material comprises an adhesive tape.

31. The package, as set forth in claim 28, wherein the substrate comprises a slot.

32. The package, as set forth in claim 31, wherein the substrate comprises two areas bounded by an at least partially adhesive periphery, each area being disposed adjacent to the slot.

33. The package, as set forth in claim 32, wherein each of the two areas are rectangular.

34. The package, as set forth in claim 28, wherein the at least one area bounded by the at least partially adhesive periphery is 30%–90% covered by the adhesive material.

35. The package, as set forth in claim 28, wherein the adhesive material comprises a plurality of apertures.

36. The package, as set forth in claim 30, comprising circular cut-outs in the adhesive tape.

37. The package, as set forth in claim 30, comprising curved cut-outs in the adhesive tape.

38. The package, as set forth in claim 30, comprising substantially rectangular cut-outs in the adhesive tape.

39. The package, as set forth in claim 31, wherein the adhesive material comprises an adhesive tape, and wherein the adhesive tape comprises a plurality of adhesive strips disposed in the at least one area.

40. The package, as set forth in claim 39, wherein the adhesive strips comprise substantially rectangular strips extending generally parallel to the slot.

41. The package, as set forth in claim 39, wherein the adhesive strips comprise substantially rectangular strips extending generally perpendicular to the slot.

42. A method of manufacturing an integrated circuit package, comprising the acts of:
(a) providing a substrate;
(b) disposing an adhesive material onto the substrate within at least one area bounded by at least a partially adhesive periphery and covering less than 100% of the area bounded by the adhesive periphery; and
(c) disposing an integrated circuit die onto the adhesive material.

43. The method, as set forth in claim 42, wherein act (a) further comprises the act of providing a substrate with a slot cut therethrough.

44. The method, as set forth in claim 42, wherein act (b) further comprises disposing an adhesive tape onto the substrate within at least one area bonded by at least a partially adhesive periphery and covering less than 100% of the area bounded by the adhesive periphery.

45. The method, as set forth in claim 43, wherein act (b) further comprises disposing an adhesive tape onto the substrate within two areas bounded by the at least partially adhesive peripheries and covering less than 100% of the areas bounded by the adhesive peripheries, each area being disposed adjacent to the slot.

46. The method, as set forth in claim 42, wherein act (b) further comprises disposing an adhesive tape on 30%–90% of the area bounded by the at least partially adhesive periphery.

47. The method, as set forth in claim 46, wherein act (b) comprises disposing an adhesive tape comprising a plurality of apertures onto the substrate.

48. The method, as set forth in claim 47, wherein act (b) comprises disposing an adhesive tape comprising a plurality of apertures which are circular cut-outs in the adhesive tape.

49. The method, as set forth in claim 47, wherein act (b) comprises disposing an adhesive tape comprising a plurality of apertures which are curved cut-outs in the adhesive tape.

50. The method, as set forth in claim 47, wherein act (b) comprises disposing an adhesive tape comprising a plurality of apertures which are rectangular cut-outs in the adhesive tape.

51. The method, as set forth in claim 47, wherein act (b) comprises disposing an adhesive tape comprising a plurality of adhesive strips.

52. The method, as set forth in claim 51, further comprising disposing adhesive strips which are rectangular strips extending parallel to a slot in the substrate cut therethrough.

53. The method, as set forth in claim 51, further comprising disposing adhesive strips which are rectangular strips extending perpendicular to a slot in the substrate cut therethrough.

54. A method of manufacturing an integrated circuit package, comprising the acts of:
(a) providing a substrate having an adhesive material thereon, the adhesive material being disposed in at least one area bounded by an at least partially adhesive periphery and covering less than 100% of the area bounded by the adhesive periphery; and (b) disposing an integrated circuit die onto the adhesive material.

55. The method, as set forth in claim 54, wherein act (a) further comprises the act of providing a substrate with a slot cut therethrough.

56. The method, as set forth in claim 54, wherein act (a) further comprises providing a substrate having an adhesive tape thereon, the adhesive tape being disposed in at least one area bounded by an at least partially adhesive periphery and covering less than 100% of the area bounded by the adhesive periphery.

57. The method, as set forth in claim 55, wherein act (a) further comprises providing a substrate having an adhesive tape thereon, the adhesive tape being disposed onto the substrate within two areas bounded by an at least partially adhesive periphery and covering less than 100% of the area bounded by the adhesive periphery.

58. The method, as set forth in claim 54, wherein act (a) further comprises providing a substrate having an adhesive tape thereon, the adhesive tape being disposed on 30% to 90% of the area bounded by the at least partially adhesive periphery.

59. The method, as set forth in claim 58, wherein act (a) comprises disposing an adhesive tape comprising a plurality of apertures onto the substrate.

60. The method, as set forth in claim 59, wherein act (a) comprises disposing an adhesive tape comprising a plurality of apertures which are circular cut-outs in the adhesive tape.

61. The method, as set forth in claim 59, wherein act (a) comprises disposing an adhesive tape comprising a plurality of apertures which are curved cut-outs in the adhesive tape.

62. The method, as set forth in claim 59, wherein act (a) comprises disposing an adhesive tape comprising a plurality of apertures which are rectangular cut-outs in the adhesive tape.

63. The method, as set forth in claim 59, wherein act (a) comprises disposing an adhesive tape comprising a plurality of adhesive strips.

64. The method, as set forth in claim 63, further comprising disposing adhesive strips which are rectangular strips extending parallel to a slot in the substrate cut therethrough.

65. The method, as set forth in claim 63, further comprising disposing adhesive strips which are rectangular strips extending perpendicular to a slot in the substrate cut therethrough.

66. An integrated circuit package comprising:

an integrated circuit die; and a substrate permanently coupled to the integrated circuit die by at least one adhesive area, wherein the at least one adhesive area comprises a plurality of apertures therethrough.

* * * * *